(12) United States Patent
Bucci et al.

(10) Patent No.: US 10,749,538 B2
(45) Date of Patent: Aug. 18, 2020

(54) OSCILLATOR ARRANGEMENT AND METHOD FOR SYCHRONIZING AN OSCILLATOR

(71) Applicant: Infineon Technologies AG, Neubiberg (DE)

(72) Inventors: Marco Bucci, Graz (AT); Raimondo Luzzi, Graz (AT)

(73) Assignee: Infineon Technologies AG, Neubiberg (DE)

( * ) Notice: Subject to any disclaimer, the term of this patent is extended or adjusted under 35 U.S.C. 154(b) by 99 days.

(21) Appl. No.: 16/185,970

(22) Filed: Nov. 9, 2018

(65) Prior Publication Data
US 2019/0165799 A1   May 30, 2019

(30) Foreign Application Priority Data

Nov. 24, 2017   (DE) .................. 10 2017 127 805

(51) Int. Cl.
| | | |
|---|---|---|
| H03L 7/10 | (2006.01) | |
| H03L 7/099 | (2006.01) | |
| H04L 7/033 | (2006.01) | |
| H03L 7/00 | (2006.01) | |
| H03K 3/84 | (2006.01) | |
| H03K 17/00 | (2006.01) | |
| H03B 5/18 | (2006.01) | |
| H03K 5/01 | (2006.01) | |
| H03K 5/00 | (2006.01) | |

(52) U.S. Cl.
CPC ............... *H03L 7/104* (2013.01); *H03B 5/18* (2013.01); *H03K 3/84* (2013.01); *H03K 5/00* (2013.01); *H03K 5/01* (2013.01); *H03K 17/00* (2013.01); *H03L 7/00* (2013.01); *H03L 7/0991* (2013.01); *H04L 7/0331* (2013.01)

(58) Field of Classification Search
CPC ............ H03K 3/84; H03K 17/00; H03K 5/01; H03K 5/00; H03L 7/10; H03L 7/099; H03L 7/00; H04L 7/033
USPC ...................... 331/111, 143, 175, 94, 97, 124
See application file for complete search history.

(56) References Cited

U.S. PATENT DOCUMENTS

2008/0180151 A1* 7/2008 Gong .................. H03K 3/0231
327/175

FOREIGN PATENT DOCUMENTS

| DE | 102013107669 A1 | 1/2014 |
|---|---|---|
| JP | H04126413 A | 4/1992 |

OTHER PUBLICATIONS

German Patent Office, Office Action issued for DE 102017127805. 2, dated Jul. 13, 2018, 5 pages.

* cited by examiner

*Primary Examiner* — Arnold M Kinkead
(74) *Attorney, Agent, or Firm* — Schiff Hardin LLP

(57) ABSTRACT

An oscillator arrangement having an oscillator configured to generate an oscillation signal having two half-cycles, an input configured to receive a synchronization signal including synchronization triggers, a synchronizer configured to reject a synchronization trigger received during a first part of a half-cycle and to synchronize the oscillator to a synchronization trigger received during a second part of the half-cycle, and a controller configured to prolong the second part of the half-cycle in response to receiving a synchronization trigger during the first part of the half-cycle.

20 Claims, 14 Drawing Sheets

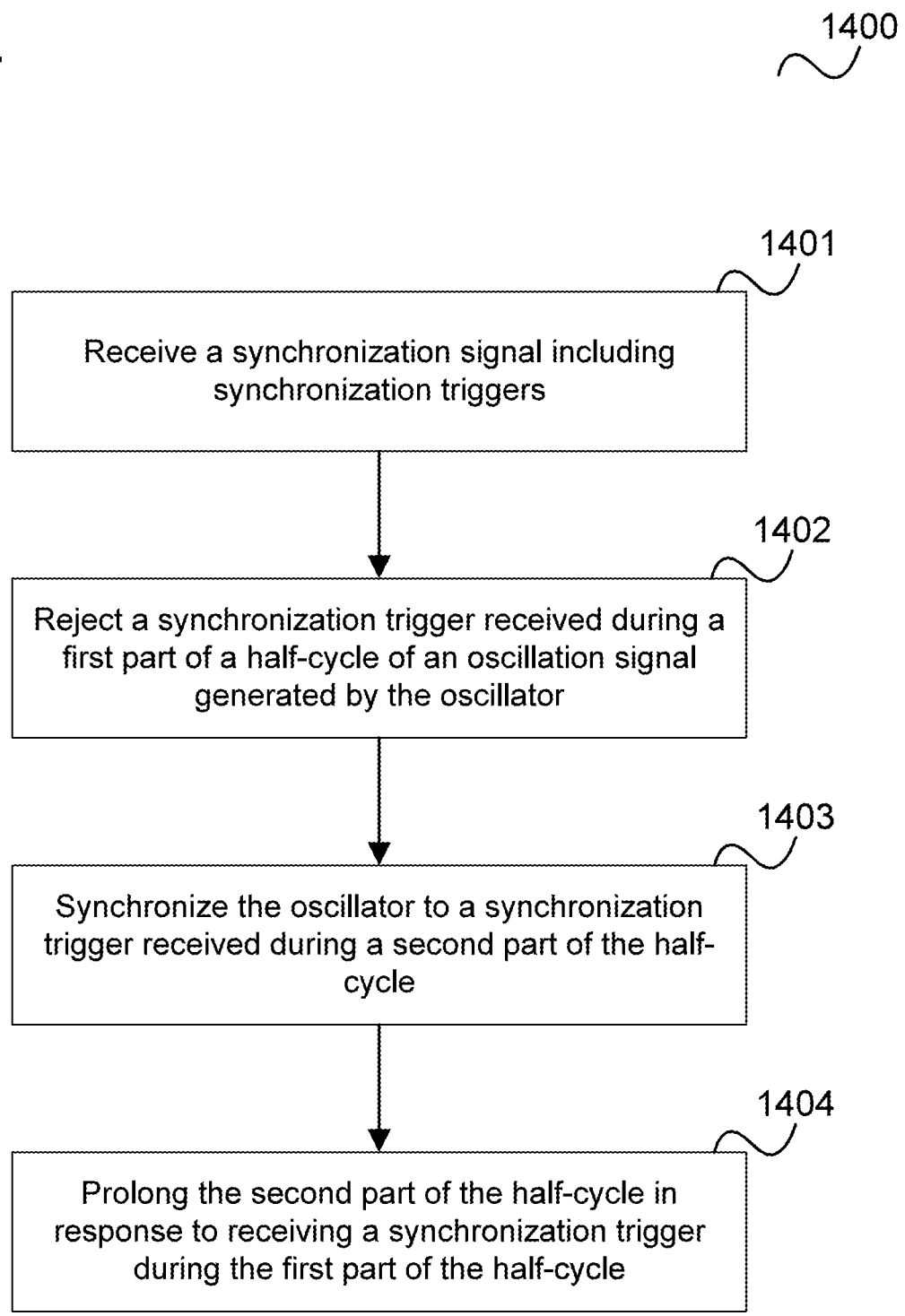

OSCILLATOR ARRANGEMENT AND METHOD FOR SYCHRONIZING AN OSCILLATOR

DETAILED DESCRIPTION

The present disclosure relates to oscillator arrangements and methods for synchronizing an oscillator.

Phase-Locked Loop (PLL) devices are commonly used in that applications where a periodic signal, synchronous with a reference signal, must be generated. A PLL consists of a variable frequency oscillator where, by means of a phase comparison, the frequency is adjusted in order to be locked on the phase of the reference signal. Depending on both phase and frequency difference between the PLL oscillator and the reference signal, the phase locking operation can take several periods. Therefore, if the reference signal is not continuously available, but appears from time to time and even for few periods, the phase locking operation can be an issue. Indeed, in such a case, a phase error, possibly quite large, should be corrected in a few cycles. The application scenario is even worse in case that the reference signal, while being stable as period, may disappear and reappear for few periods with a random phase shift. In such an extreme case, a conventional PLL could not operate at all. Accordingly, oscillators which efficiently synchronize to a reference clock, even for example in a scenario where the reference signal disappears and reappears with an unknown phase shift.

DRAWINGS

In the drawings, like reference characters generally refer to the same parts throughout the different views. The drawings are not necessarily to scale, emphasis instead generally being placed upon illustrating the principles of the disclosure. In the following description, various aspects are described with reference to the following drawings, in which:

FIG. 14 shows a flow diagram illustrating a method for synchronizing an oscillator according to an embodiment.

The following detailed description refers to the accompanying drawings that show, by way of illustration, specific details and aspects of this disclosure in which aspects of the disclosure may be practiced. Other aspects may be utilized and structural, logical, and electrical changes may be made without departing from the scope of the disclosure. The various aspects of this disclosure are not necessarily mutually exclusive, as some aspects of this disclosure can be combined with one or more other aspects of this disclosure to form new aspects.

DETAILED DESCRIPTION

If phase locking is needed only when a reference signal (i.e. a synchronisation signal) is available, a synchronized oscillator is a standard solution which provides an almost immediate locking.

Figure 1:
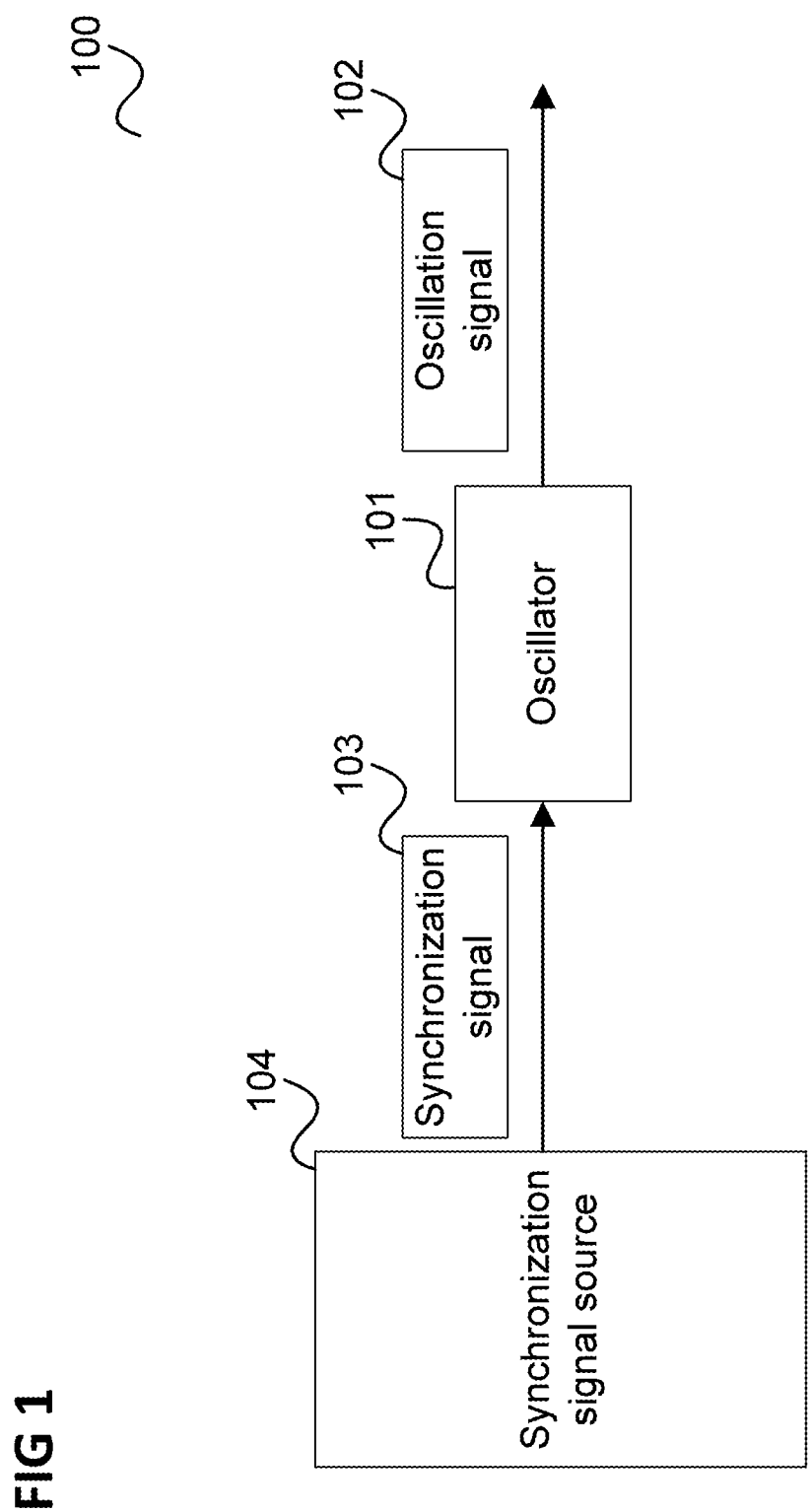
FIG. 1 shows an oscillator arrangement.

FIG. 1 shows an oscillator arrangement 100.

The oscillator arrangement 100 includes an oscillator 101 which generates an oscillation signal 102. The oscillation signal 102, which may be a square wave signal but may also have other forms, e.g. the form of a sine, has two alternating half-cycles (or semi-periods), e.g. a half-cycle during which the signal is high and a half-cycle during which the signal is low. In theory, the half-cycles are periodically repeated but in practical use, the oscillation signal 102 needs to be synchronized to a reference signal or synchronization signal 103 e.g. due to the fact that the frequency of the oscillator 101 drifts etc. The reference signal is 103 is provided by a reference signal source 104 which may for example include a crystal oscillator but which may also generate the reference signal 103 based on a radio reception of a reference frequency from a transmitter. For this reason, it may occur that the reference signal 103 is unavailable from time to time and the oscillator 101 needs to keep up the oscillation signal 102 and be able to synchronize to the synchronization signal 103 when it reappears.

An oscillator arrangement 100 as shown in FIG. 1 and as for example provided according to various embodiments may be applied in any device that requires an oscillation signal which may include radio communication devices, which e.g. require a carrier frequency, display devices which require a scanning frequency, data processing devices which operate according to a clock etc.

Figure 2:
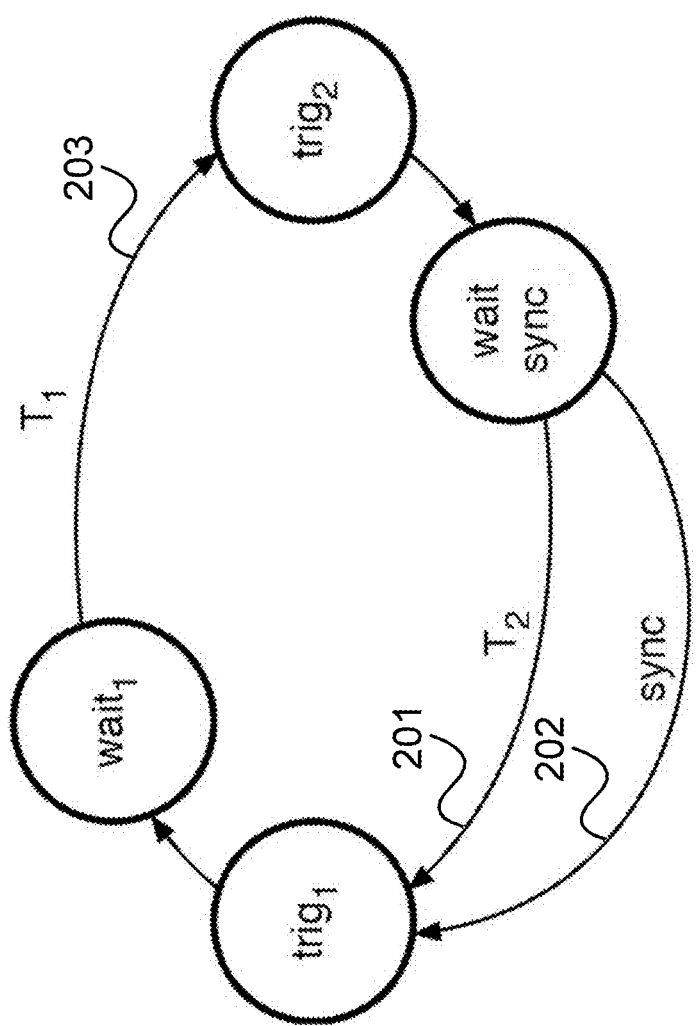
FIG. 2 illustrates an example of an operation of a synchronized oscillator in form of a state diagram.

FIG. 2 illustrates an example of an operation of a synchronized oscillator such as the oscillator 101 of FIG. 1 in form of a state diagram 200.

The state diagram 200 includes two states trig1 and trig2 which are transient (i.e. zero duration) states representing the triggering of the half-cycles. Further, the state diagram 200 includes a wait1 state and a wait_sync state which represent the durations of the trig1 state (first half-cycle) and the trig2 state (second half-cycle), respectively.

As shown by a first transition 201 in the state diagram 200, a new oscillator period (i.e. the first half-cycle) can be triggered by the expiration of a time T2 (i.e. the expiration of the free-running period of the oscillator) or, as illustrated by a second transition 202, by the occurrence of a sync event (i.e. reception of a synchronization trigger, e.g. a synchronization pulse) during the time T2.

A third transition 203 illustrates the transition from the first half-cycle to the second half-cycle after a duration $T_1$.

The oscillator has thus a free-running period of $Tosc=T_1+T_2$, which, by design in this example, is longer than the reference signal period Tsync. Hence, when the reference signal is present, the synchronizing trigger (extracted from one or both of the reference signal edges) occurs before the expiring time of the oscillator period. As a result, the period of the oscillator is forced by the synchronizing signal.

Figure 3:
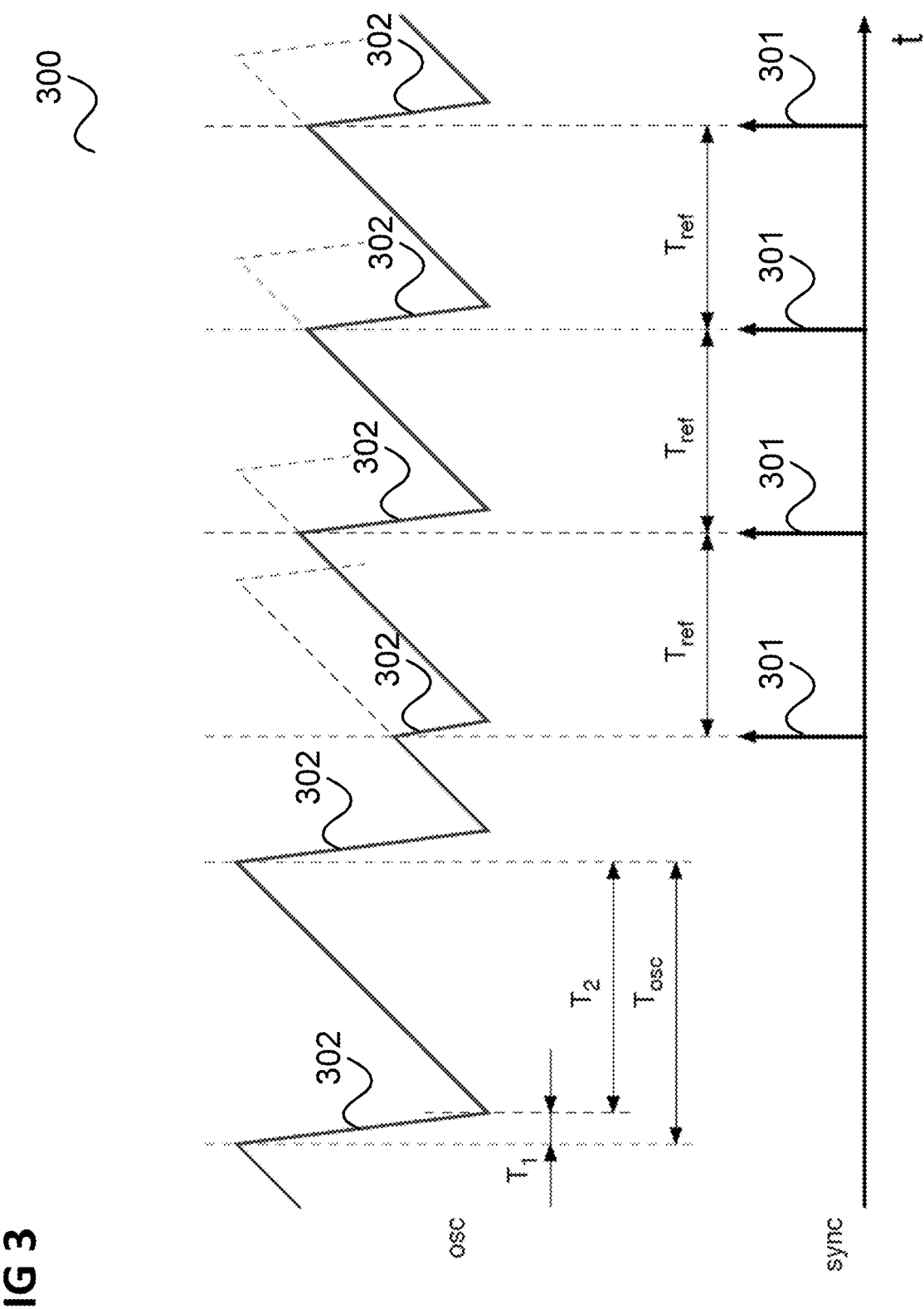
FIG. 3 shows a signal diagram illustrating a typical application of the principle of FIG. 2.

FIG. 3 shows a signal diagram 300 illustrating a typical application of the principle of FIG. 2 for a saw-tooth synchronized oscillator used for frame and line scanning in an analog TV where the synchronism triggers, extracted from the video input, are exploited in order to synchronize the saw-tooth oscillators used for the line and frame scanning.

Time runs from left to right in FIG. 3 (as well as in all signal diagrams described in the following). Synchronization triggers 301 trigger the first half-cycle 302 during which the oscillator signal is falling.

Figure 4:
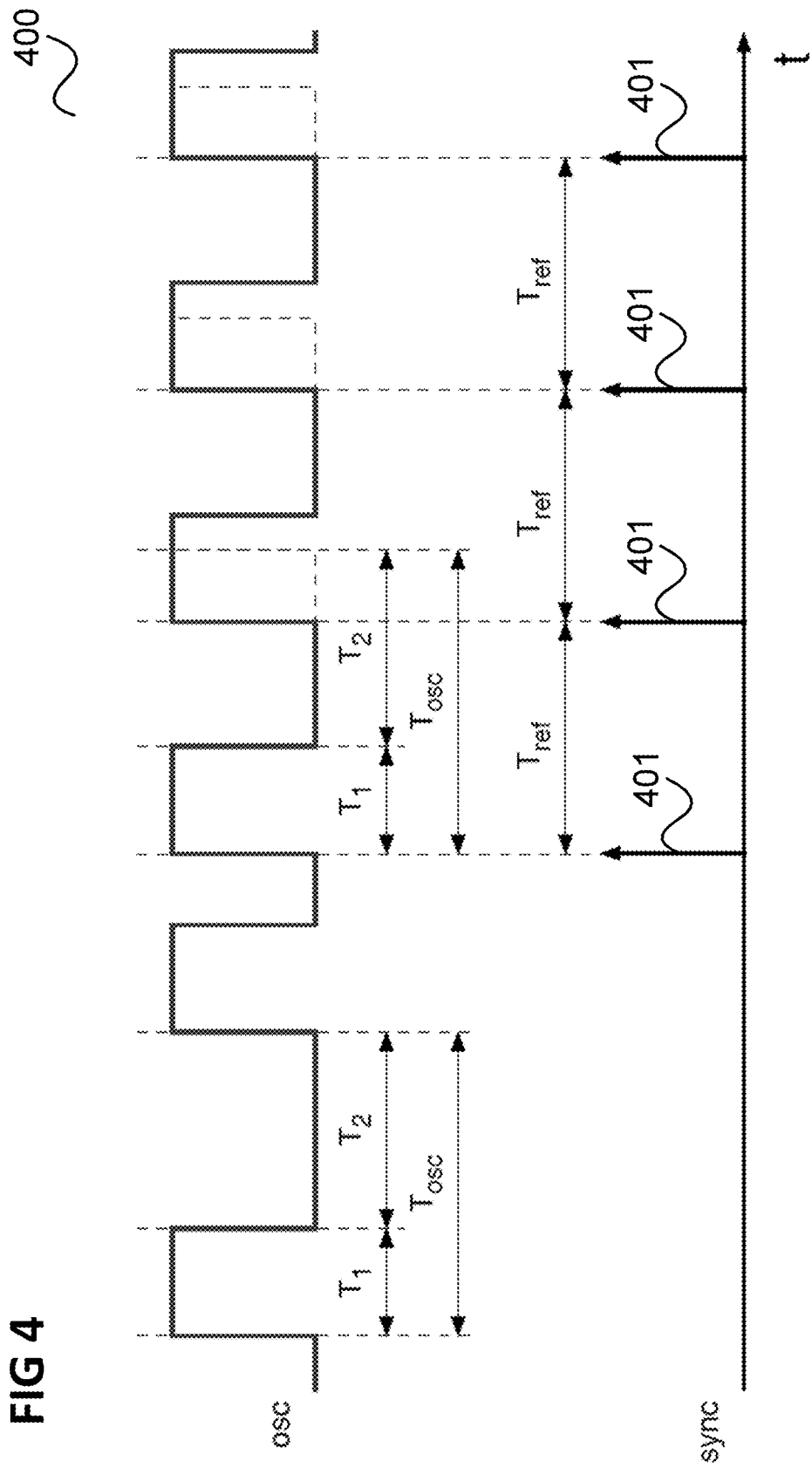
FIG. 4 shows a signal diagram illustrating the application of the principle of FIG. 2 to a square-wave oscillator.

FIG. 4 shows a signal diagram 400 illustrating the application of the principle of FIG. 2 to a square-wave oscillator. Synchronization triggers 401 trigger the first half-cycle 302 during which the oscillator signal is high.

It should be noted that if T2>Tref, only one oscillator period is needed to lock the oscillator to the reference signal.

While a synchronized oscillator operating according to FIG. 2 has a simple implementation and can immediately lock on the reference signal, it misses two major features of a PLL (Phase-Locked Loop): the free-running frequency of the oscillator is not tuned to be close to the frequency of the reference signal and the locking sequence is not guaranteed to be free from generating glitches. Namely, depending on the reciprocal phase between oscillator and reference signal, a too short semi-period can be generated. Indeed, as can be seen from FIG. 4, the minimal semi-period (half-cycle) duration depends on the time occurring between the end of an oscillator semi-period and the next synchronization trigger (e.g. pulse or edge of the synchronization signal). As a result, short semi-periods, or even glitches, can be randomly generated when the reference signal appears. This fact may for example be an issue when the oscillator output is used as a clock for a digital device.

According to various embodiments, an oscillator arrangement is proposed that, similarly to a PLL, provides a free-running frequency close to the reference one and no short semi-period generation, but, additionally, also provides a fast locking sequence similarly to the synchronized oscillators operating according to FIG. 2.

For the sake of simplicity, in the following (as well as in the previous examples of FIGS. 3 and 4) the case is considered where only one edge of the reference signal 103 is used for synchronization and, additionally, the oscillator 101 is synchronized on the same frequency as the reference signal 103. However, the approaches described in the following can also be used for synchronizing on both edges of the reference signal 103 and/or for oscillator frequencies which are multiple of the frequency of the reference signal 103.

Figure 5:
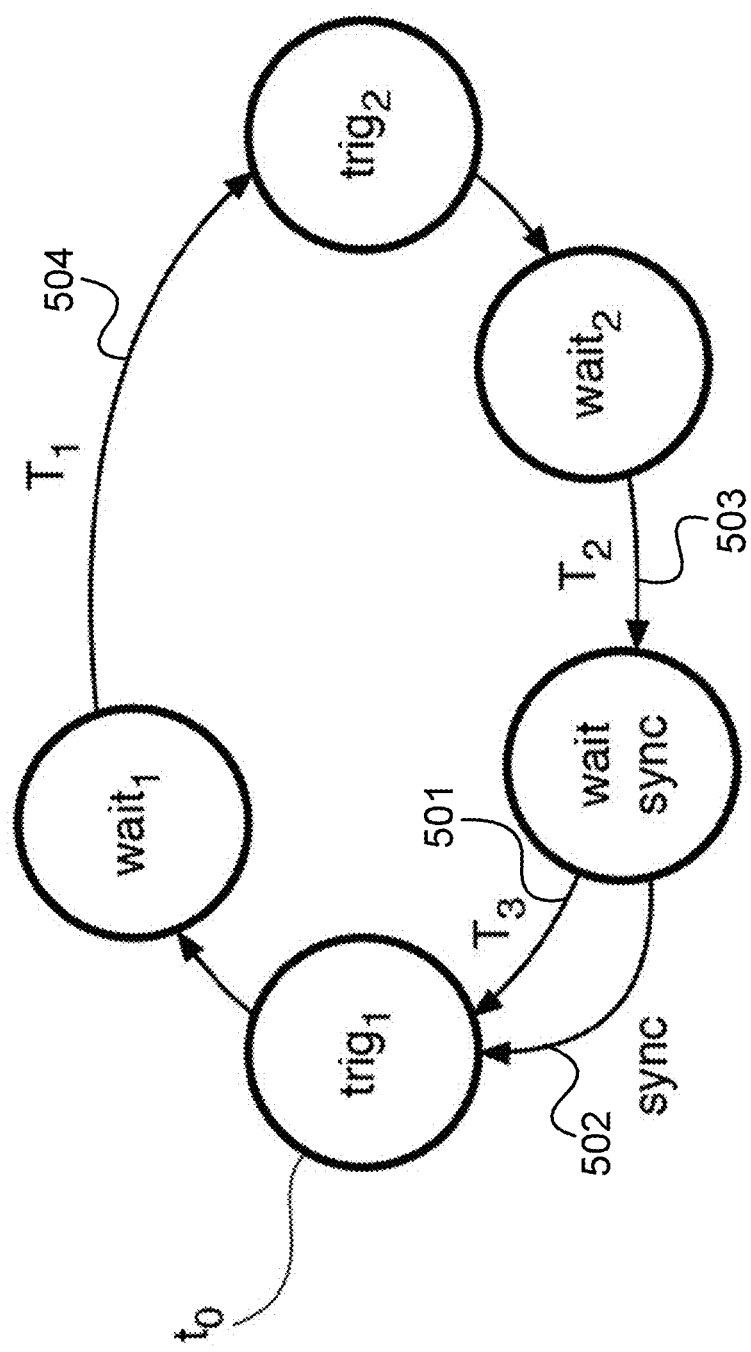
FIG. 5 shows a state diagram illustrating an operation of a synchronized oscillator according to an embodiment.

FIG. 5 shows a state diagram 500 illustrating an operation of a synchronized oscillator such as the oscillator 101 of FIG. 1 according to an embodiment.

Similarly to FIG. 2, the state diagram 500 includes two states trig1 and trig2 which are transient (zero duration) states representing the triggering of the half-cycles.

Further, as in FIG. 2, the duration of the first semi-period consists of the fixed time T1, but the second semi-period is split in a fixed time T2 and in a variable time T3. A wait1 state represents the duration of the first half-cycle, a wait2 state represents the duration of the fixed part of the second half-cycle and a wait_sync state represents the variable duration of the second half-cycle.

As shown by a first transition 501 in the state diagram 500, a new oscillator period (i.e. the first half-cycle) can be triggered by the expiration of the time T3 or, as illustrated by a second transition 502, by the occurrence of a sync event (i.e. reception of a synchronization trigger, e.g. a synchronization pulse) during the time T3.

A third transition 503 occurs when the fixed time part of the second half-cycle (of duration $T_2$) has expired and a fourth transition 504 represents the expiry of the duration $T_1$ of the first half-cycle.

Thus T2 is the minimal duration of the second semi-period and T3 is an additional time which is dynamically set in order to capture the next synchronization signal. In other words, T2 is a guard time which guarantees that no too short second semi-periods can be generated, while T3 is the time reserved to synchronization.

As explained further below, according to various embodiments, when the reference signal 103 is present, as well as in any PLL, a proper regulation loop adjusts the free-running duration of the oscillation period Tosc=T1+T2+T3 to be as close as possible to the reference period Tref. This means that, unlike the synchronized oscillators in FIGS. 3 and 4, the free-running frequency is tuned to the frequency of the reference signal 103.

It should be noted that if Tosc is tuned to be close to Tref the synchronization mechanism of FIG. 2 does not work. Further, it should be noted that if the free-running duration of the oscillation period Tosc=T1+T2+T3 is tuned to be as close as possible to the reference period Tref it can take a long time before a synchronization trigger falls in T3 and, once it happens, if Tosc<Tref, the next synchronization trigger will be lost (i.e. T3 will expire before of it).

Therefore, according to various embodiments, a synchronization mechanism is used in which the time T3 may be prolonged if a synchronization trigger was missed, i.e. did not fall within the variable part of the second semi-cycle (of duration within $T_3$).

In order to describe how the synchronization mechanism operates, the following quantities are defined:

t0: starting time of the last oscillator period. All the following timings are referred to t0.

Treject=T1+T2: rejection period of the synchronization signals.

Tsync: time to the next synchronization signal.

Tmax=T1+T2+T3: maximal time to the end of the current oscillator period.

Additionally, as an example and for better understanding, it is assumed that the free-running oscillator period Tosc is divided into 8 almost identical ΔT intervals:

$$Tosc=8\Delta T$$

and that $$T1=4\Delta T;\ T2=3\Delta T;\ T3=\Delta T.$$

According to these definitions, the synchronized oscillator rejects a synchronization trigger when Tsync≤Treject.

Figure 6:
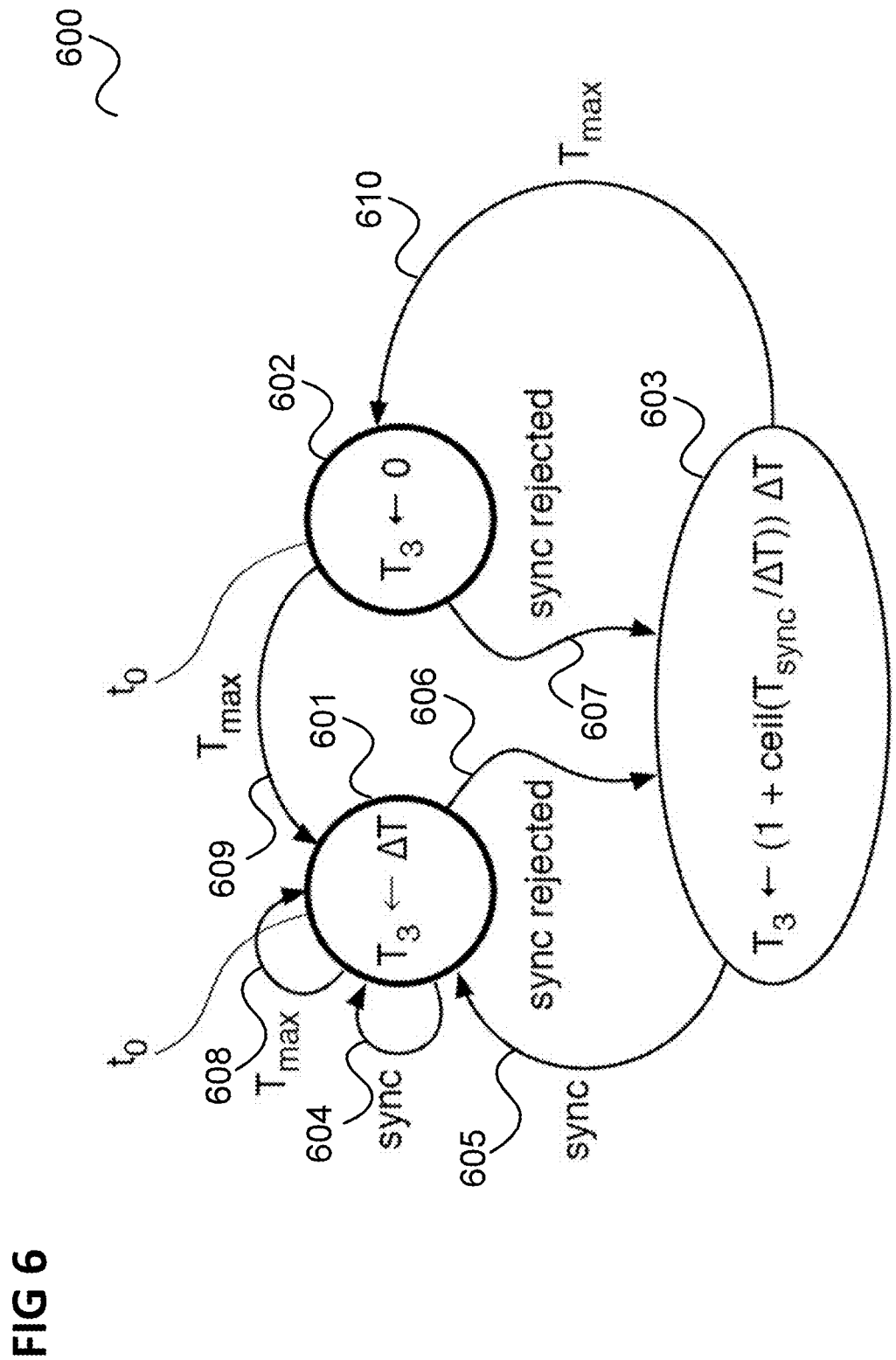
FIG. 6 shows a state diagram illustrating how a parameter of the state diagram of FIG. 5 is dynamically assigned depending on the occurrences of the synchronization triggers.

FIG. 6 shows a state diagram 600 illustrating how T3 of the state diagram 500 is dynamically assigned depending on the occurrences of the synchronization triggers.

In the state diagram 600, there are three states 601, 602, 603 which correspond to different lengths of T3.

A first transition 604 between the first state and itself and a second transition 605 from the third state 603 to the first state 601 correspond to a sync (synchronization) event which indicates the occurrence of a synchronization trigger during T3. (i.e. during the part of the second semi-period of length T3).

A third transition 606 from the first state 601 to the third state 603 and a fourth transition 607 from the second state 602 to the third state 603 correspond to a synch rejected event which indicates the occurrence of a synchronization trigger within Treject (after t0).

A fifth transition 608 from the first state 601 to itself, a sixth transition 609 from the second state 602 to the first state 601 and a seventh transition 610 from the third state 603 to the second state 602 correspond to an Tmax event indicating the expiring of Tmax (after t0, i.e. the restarting of the oscillator period without any valid sync event having occurred).

Normally, at t0, T3 is initialized to $\Delta T$ and it retains this value as long as no sync rejected event occurs (i.e. as long as the oscillator receives the synchronization triggers during T3, or does not receive synchronization triggers at all due to the synchronization trigger being unavailable).

On the other hand, whenever a sync rejected event occurs, T3 is prolonged to $$(1+\text{ceil}(T\text{sync}/\Delta T))\Delta T$$

in order to wait for the next synchronization trigger of the synchronization signal. "ceil(.)" denotes the ceiling operation, the result of which is the closest integer which is equal or above its argument. The prolongation according to this formula can be seen to be based on a prediction of the period during which the next synchronization trigger occurs.

However, if the expected synchronization trigger does not occur before the expiration of Tmax, the next period restarts by setting T3 to 0 (according to the seventh transition 610). As explained below, by this it can be avoided that, if the reference signal disappears after a sync rejected event, the free running oscillation is delayed by $\Delta T$ (see example of FIG. 9 described below). It should be noted that 607 is optional and the synchronization mechanism can work similarly without 607: If a synchronization trigger occurs during the state 602, it is ignored.

When the system is in steady state, the frequency regulation loop adjusts the $\Delta T$ in order to obtain 8 $\Delta T$=Tosc≈Tref.

Figure 7:
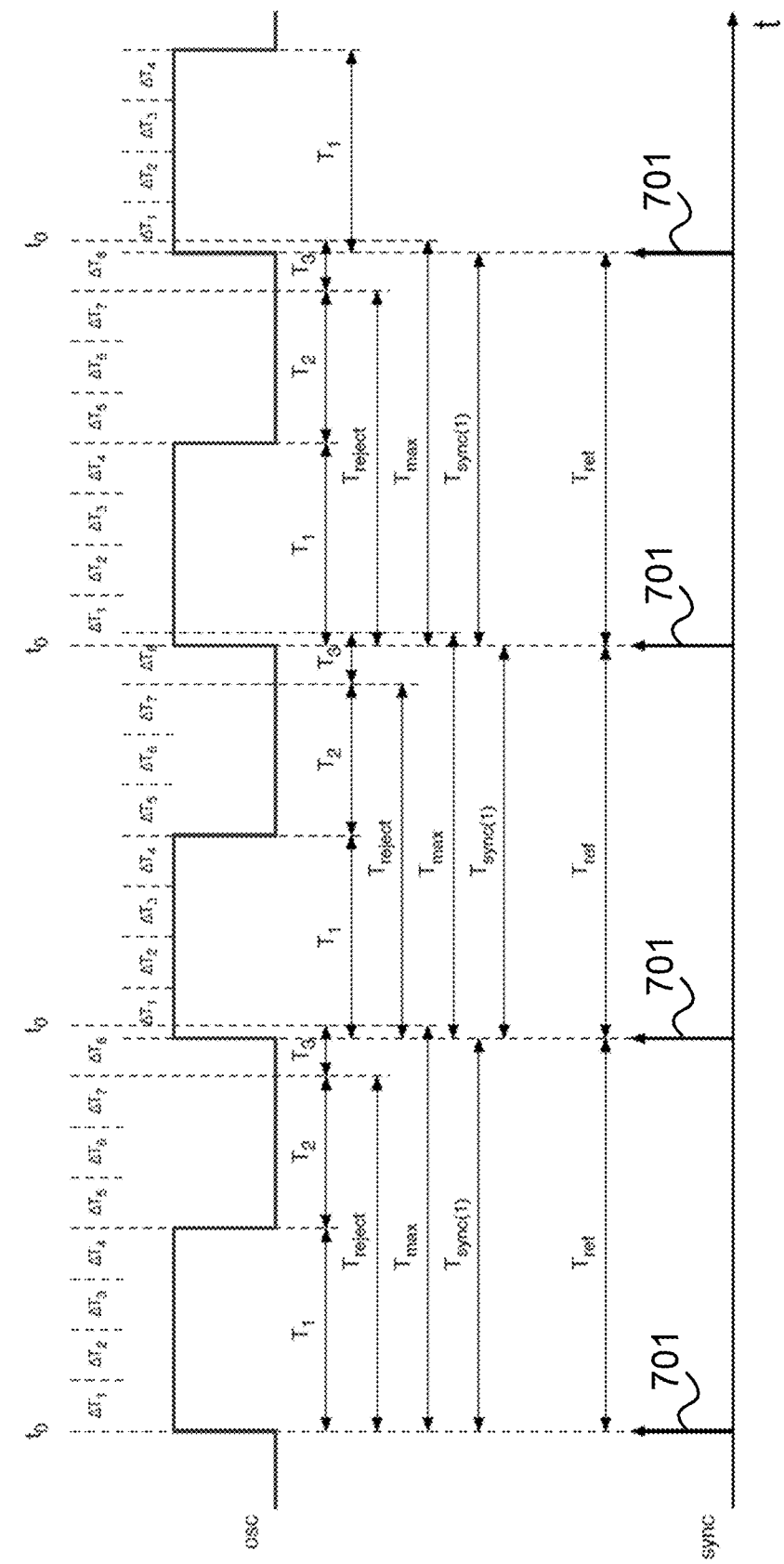
FIG. 7 shows a signal diagram illustrating a synchronization in steady state operation according to an example.
Figure 8:
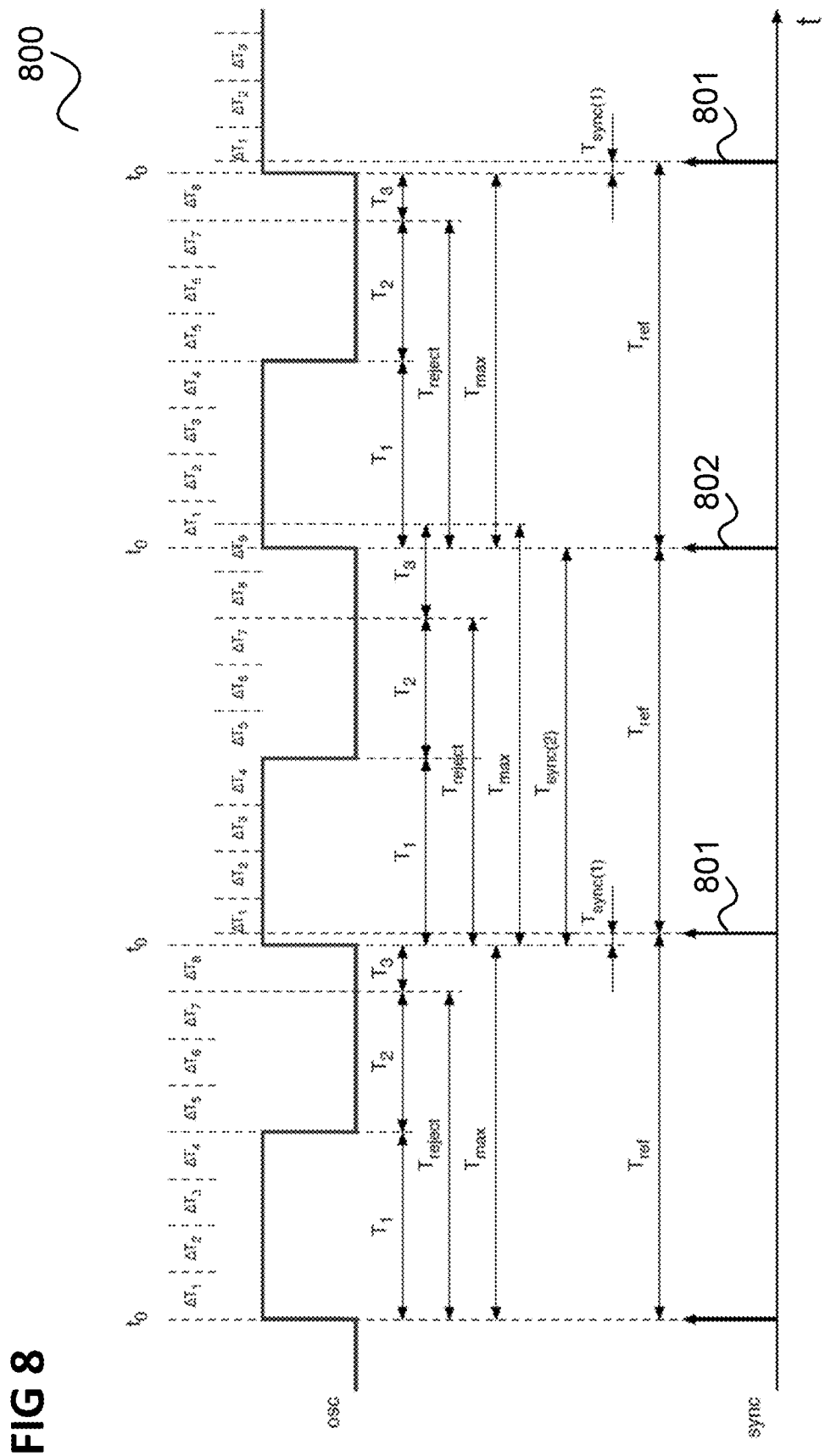
FIG. 8 shows a signal diagram illustrating a synchronization in steady state operation according to another example.

The operation of the locking mechanism is different depending on whether Tref<Tosc or Tref>Tosc as illustrated in FIGS. 7 and 8.

FIG. 7 shows a signal diagram 700 illustrating a synchronization in steady state operation when Tosc−$\Delta T$<Tref<Tosc.

When Tref<Tosc, the synchronization triggers 701 always occur before Tmax which is also equal to Tosc. Hence, the oscillator captures all the synchronization triggers 701 and operates basically the same as described in FIG. 4. Namely, the period is constant and equal to Tref. Since no synchronization trigger is rejected, the starting of a new period t0 is always triggered by a synchronization trigger.

FIG. 8 shows a signal diagram 800 illustrating a synchronization in steady state operation when Tosc<Tref<Tosc+$\Delta T$.

When Tref>Tosc, alternately, one synchronization trigger 801 is rejected (since it falls during Treject) while the next one 802 is captured (since it falls during T3 which is extended to 2 $\Delta T$). As a result, the starting of a new period t0 is alternately triggered by Tmax and by a synchronization trigger and the oscillator periods are alternately Tosc and Tosc+2(Tref−Tosc) whose average, however, is Tref.

From FIG. 8, it can be seen that, as already mentioned, without any additional expedient, if the reference signal disappears after a sync reject event, the oscillator would free oscillate with a $\Delta T$ delay. However, as mentioned above, this is avoided by means of the sixth transition 610, as it is illustrated in FIG. 9.

Figure 9:
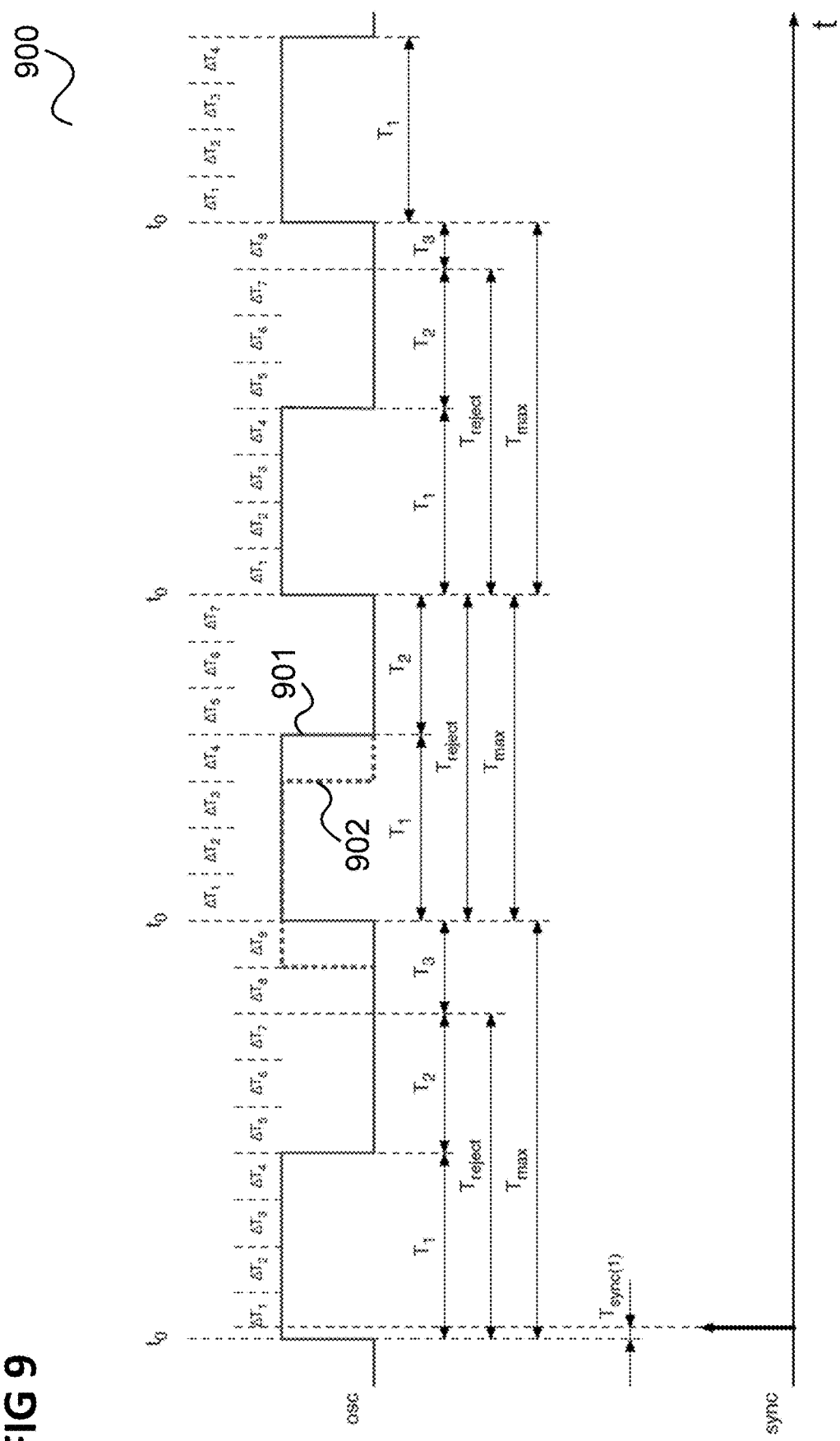
FIG. 9 shows a signal diagram illustrating a phase recovery in case the reference signal disappears after a sync rejected event.

FIG. 9 shows a signal diagram 900 illustrating a phase recovery in case the reference signal disappears after a sync rejected event.

According to the state diagram 600 of FIG. 6 the initial phase shift, due to the fact that T3 is set to 2 $\Delta T$, is recovered during the next oscillator period by setting T3=0 in accordance with the sixth transition 610. As a result, just a single semi-period 901 suffers of a $\Delta T$ phase shift. A dotted line 902 indicates how the semi-period should be without the phase shift resulting from the sync rejected event. After one period, the correct phase alignment is recovered.

In the following, it is explained shown how the synchronization operates when the reference signal reappears after a pause with reference to FIGS. 10 and 11.

Figure 10:
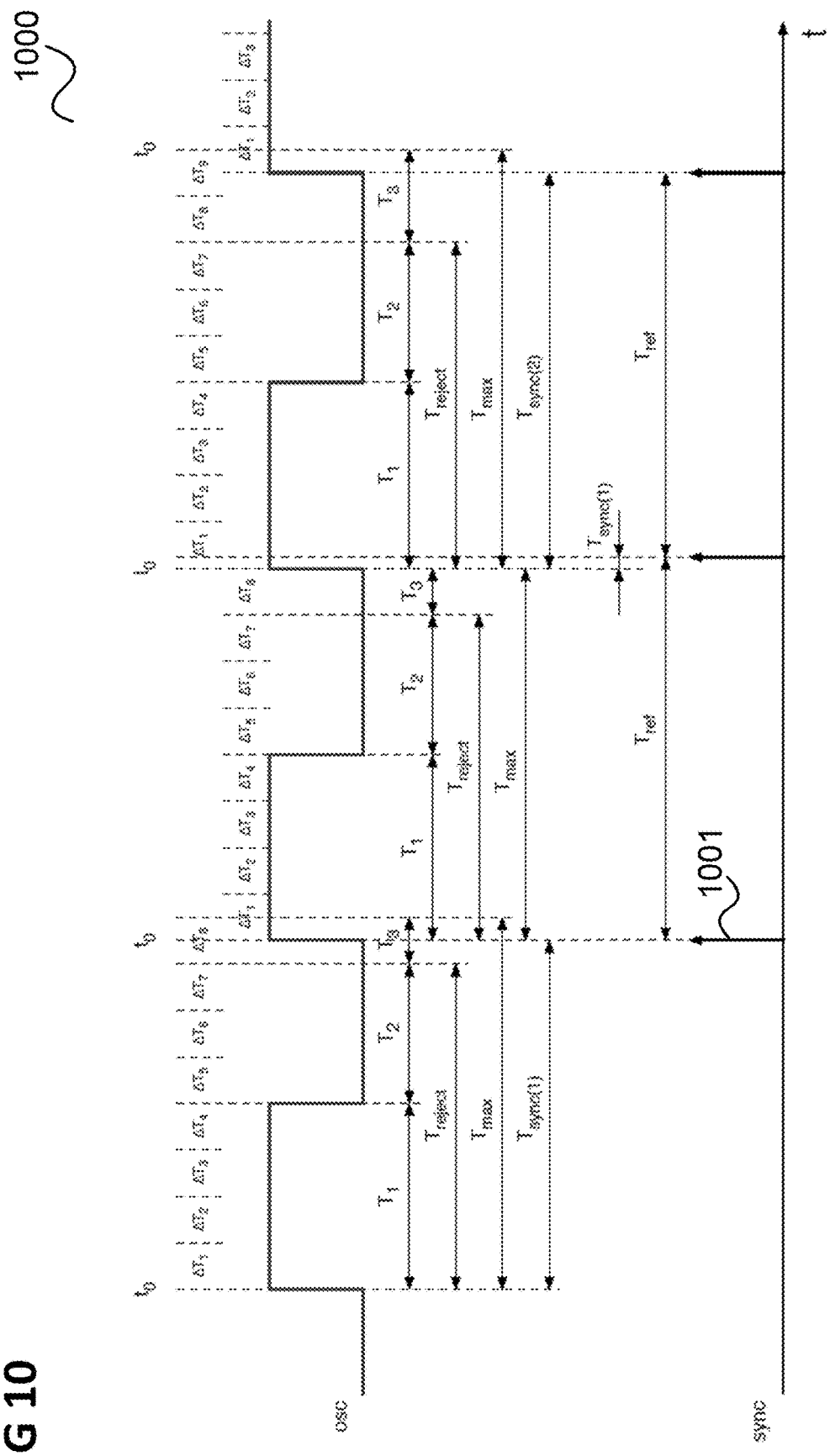
FIG. 10 shows a signal diagram illustrating a case in which a first synchronization trigger is not rejected and therefore the oscillator is immediately locked.

FIG. 10 shows a signal diagram 1000 illustrating the case that a first synchronization trigger 1001 occurs during T3 (i.e. the variable part of the second half-cycle), i.e. is not rejected, and therefore the oscillator is immediately locked. Since, in this example, Tref>Tosc, synchronization will then progress in steady state as in the example of FIG. 8.

Figure 11:
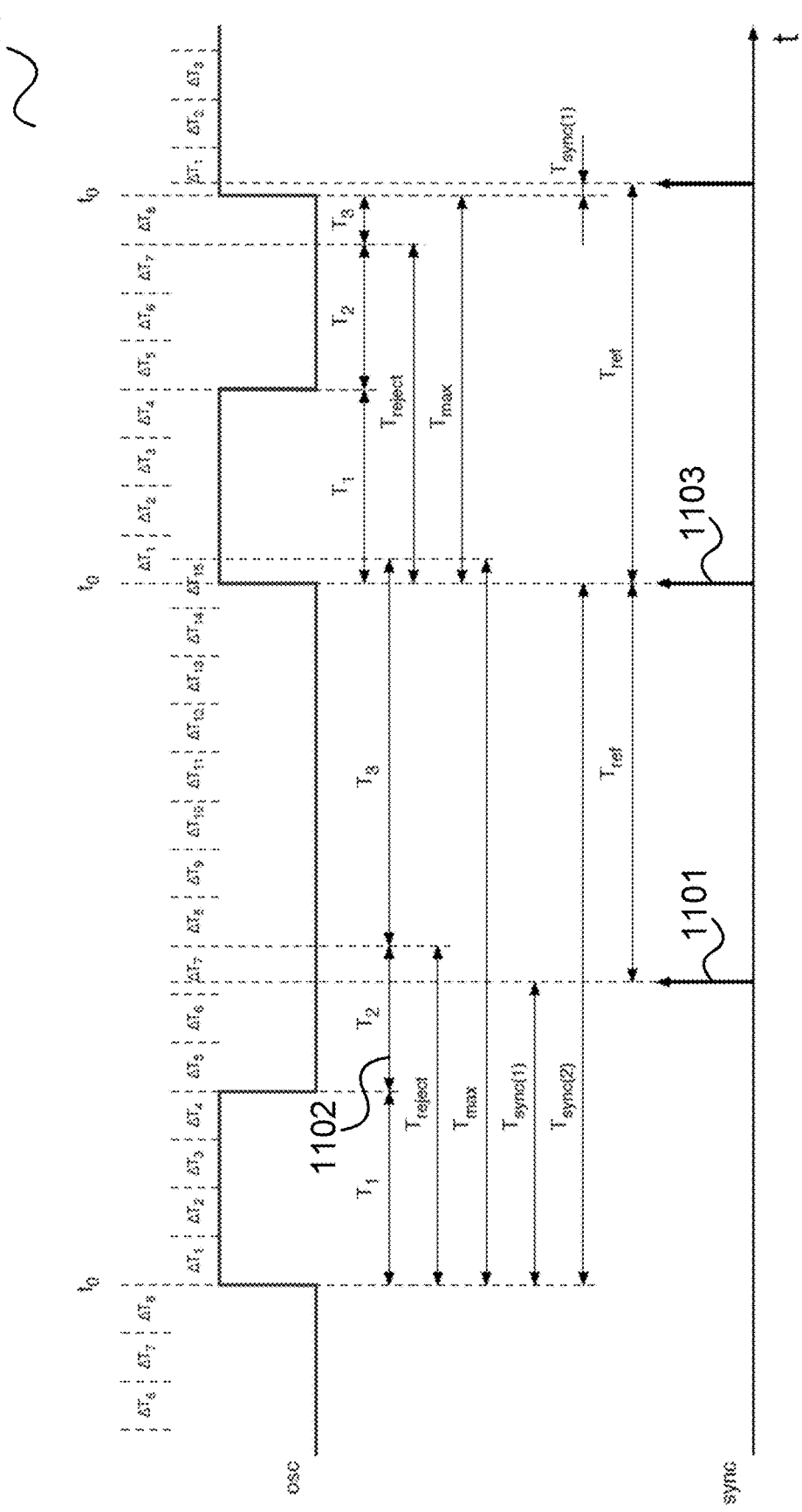
FIG. 11 shows a signal diagram illustrating a case in which a first synchronization trigger is rejected.

FIG. 11 shows a signal diagram 1100 illustrating a case in which a first synchronization trigger 1101 occurs during Treject and therefore it is lost (rejected).

This example of FIG. 11 shows the worst case when the first synchronization trigger 1101 occurs with the maximum delay before the next synchronization window (i.e. at the end of the T2 period 1102).

However, since, according to the operation state diagram 600 in FIG. 6, T3 is then prolonged to 8 $\Delta T$ (i.e. Tmax is set to 15 $\Delta T$), the following synchronization trigger 1103 is captured.

Ultimately, it can be seen that as long as Tref−$\Delta T$<Tosc<Tref+$\Delta T$, the locking mechanism can take just one period of the reference (i.e. one synchronization trigger, see FIGS. 10 and 11) and then the oscillator 101 can maintained synchronization in steady state (see FIGS. 7 and 8).

As well as in a conventional PLL, the synchronization mechanism allows adjusting the free running frequency to the reference signal frequency by means of a regulation loop. For example, $\Delta T$ can be adjusted by detecting the relative delay between the synchronization triggers and the expiration of 8$\Delta T$ (i.e., in general, Tosc). In fact, the synchronization mechanism could be also considered as an add-on to a conventional PLL and could be even enabled or disabled depending on a requested operation mode. On the other hand, it should be noted that, as long as Tref−$\Delta T$<Tosc<Tref+$\Delta T$, the synchronization mechanism can be used for operating a synchronized oscillator without the assistance of a PLL loop.

Figure 12:
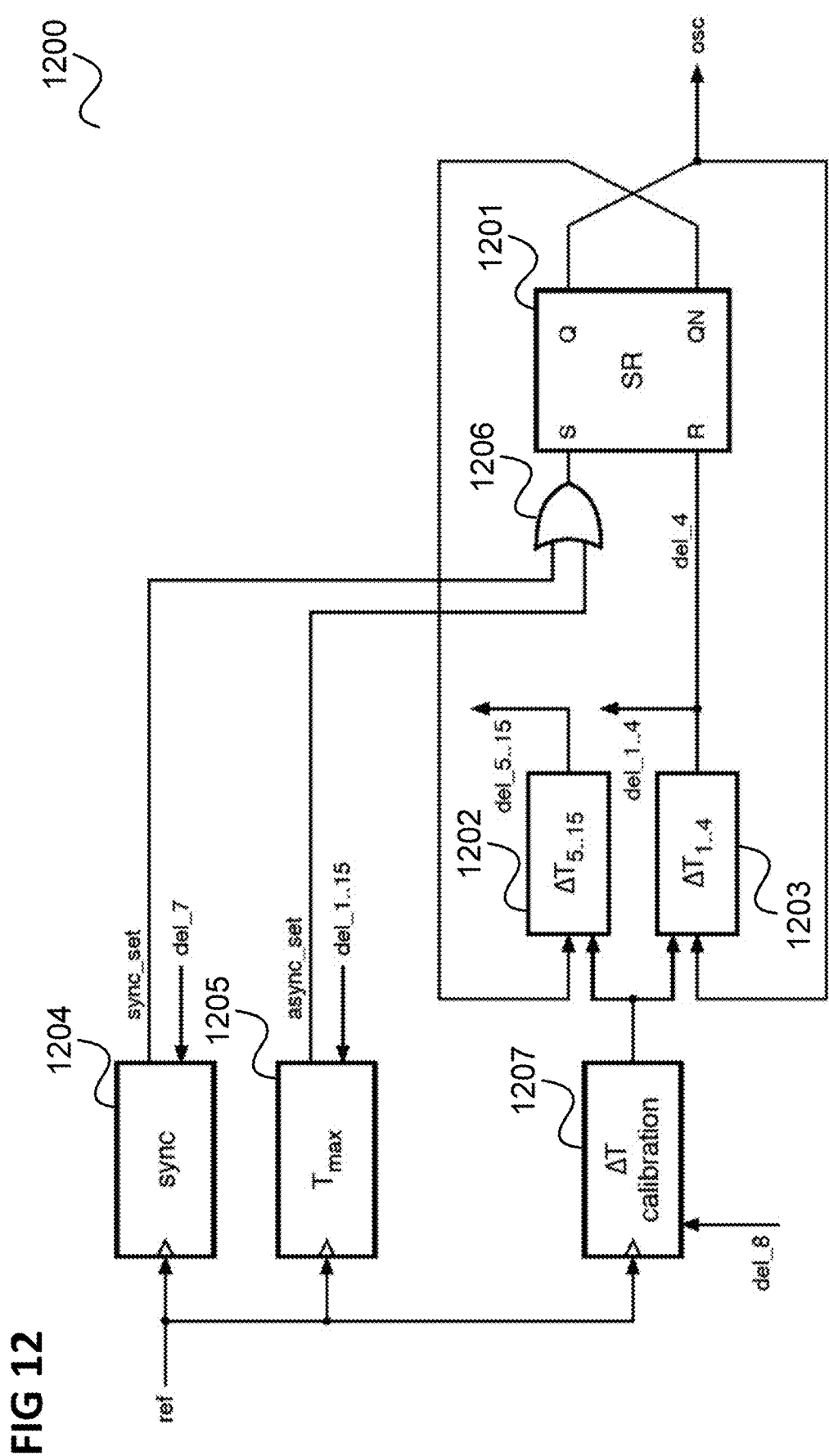
FIG. 12 illustrates a possible implementation of the synchronisation mechanism of FIGS. 5 and 6.

FIG. 12 illustrates a possible implementation of the synchronisation mechanism of FIGS. 5 and 6 by showing the main functional blocks of a synchronized oscillator 1200.

As in the above examples, the time basis is $\Delta T$ wherein the above exemplary lengths of the various periods are used as example.

The oscillator 1200 is implemented according to a classical scheme where a SR-Flip-Flop 1201 has a cross-coupled reaction through two delay elements 1202, 1203, wherein the first delay element 1202 defines the first semi-period (i.e. $\Delta T1 \ldots 4$) and the second delay period 1203 defines the second semi-period.

However, the duration of the second semi-period is not fixed but is defined by two additional synchronisation blocks 1204, 1205, which trigger the start of a new cycle by mean of the a sync_set signal (supplied by the first synchronization block 1204) or the async_set signal (supplied by the second synchronization block 1205). Namely, the sync_set signal is asserted when an active edge of the reference signal ref (supplied to the oscillator 1200) is detected after Treject (i.e. when a sync event is captured) while the async_set signal is asserted at the expiration of Tmax=T1+T2+T3 (where T3 is dynamically set according to the state diagram 600 of FIG. 6). The async_set signal and the sync_set signal are supplied to an OR gate 1206 whose output is connected to the S input of the SR-Flip-Flop 1201 such that either one can trigger a setting of the SR-Flip-Flop 1201 (and thus the beginning of the first half-cycle). The reset input of the SR-Flip-Flop 1201 is connected to the second delay element 1203 such that after a duration of 4ΔT of the first half-cycle the second half-cycle is started.

As shown in FIG. 12, the additional synchronization blocks 1204, 1205 generate the sync_set signal and the async_set signal by means of the proper delay signals del_1, del_2, del_3, . . . , del_15, which, in turn, are generated by the delay blocks 1202, 1203 according to the expression $$del\_i \leftarrow t > t0 + \Delta Ti$$

(i.e. the generic del_i signal is asserted at the expiration of the ΔTi delay).

In practice, the assertion of del_7 indicates the expiration of Treject and therefore it allows defining whether an active edge (i.e. a synchronization trigger) of the reference signal generates a sync or a sync reject event.

As already mentioned, as in a conventional PLL, the free running frequency is controlled by a feedback loop. In the implementation of FIG. 12, the feedback loop operates by shrinking or stretching the ΔT delay elements depending whether the active edges of the reference signal occur later or before the del_8 signal assertion (i.e. later or before the expiration of Tosc). This is performed by a calibration block 1207.

Figure 13:
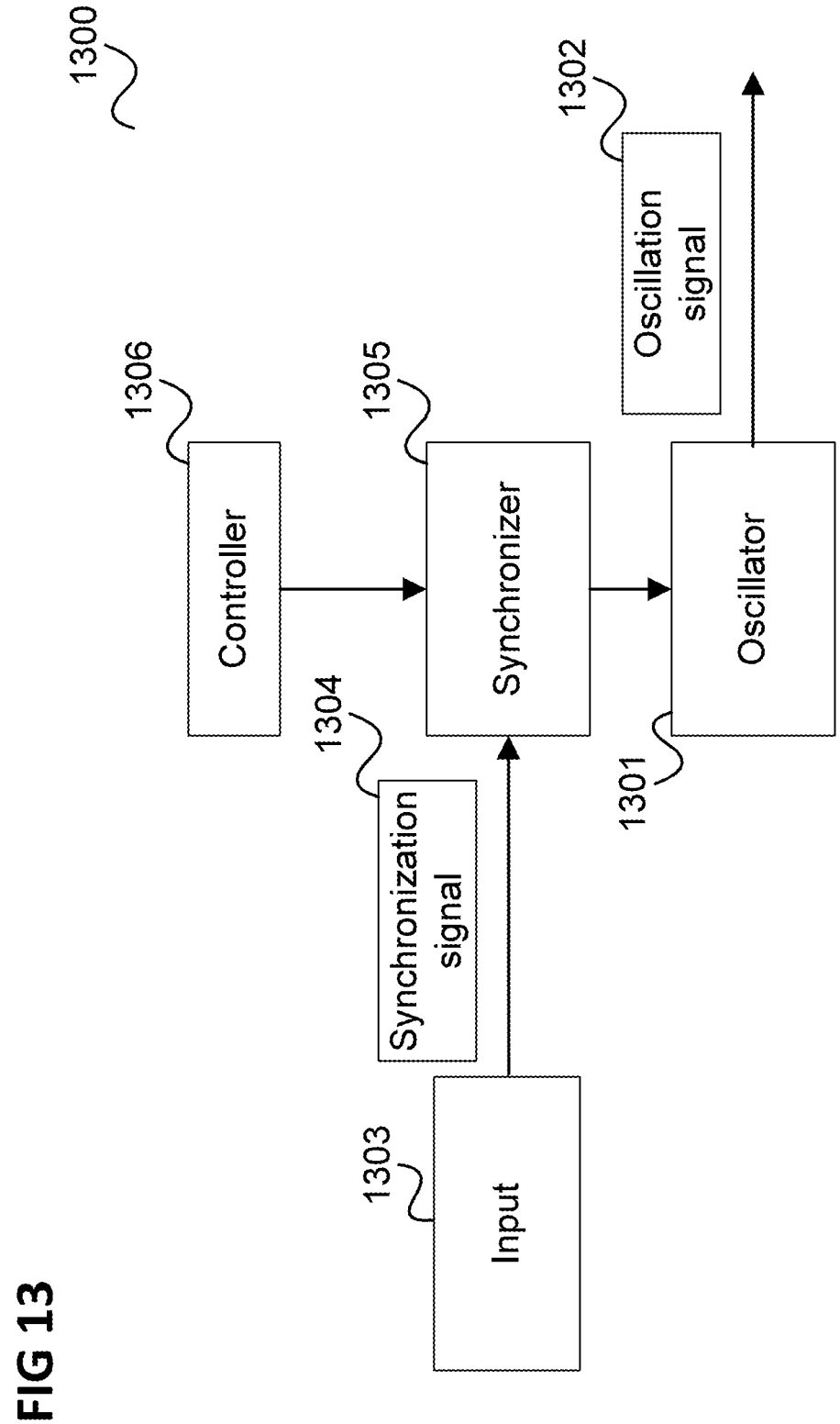
FIG. 13 shows an oscillator arrangement according to an embodiment.

In summary, according to various embodiments, an oscillator arrangement is provided as illustrated in FIG. 13.

FIG. 13 shows an oscillator arrangement 1300 according to an embodiment.

The oscillator arrangement 1300 includes an oscillator 1301 configured to generate an oscillation signal 1302 having two half-cycles and an input 1303 configured to receive a synchronization signal 1304 including synchronization triggers.

Further, the oscillator arrangement 1300 includes a synchronizer 1305 configured to reject a synchronization trigger received during a first part of a half-cycle and to synchronize the oscillator 1301 to a synchronization trigger received during a second part of the half-cycle.

The oscillator arrangement 1300 further includes a controller 1306 configured to prolong the second part of the half-cycle in response to receiving a synchronization trigger during the first part of the half-cycle.

The oscillator arrangement 1300 can be seen to implement a synchronized oscillator. The synchronizer can be for example seen to include the synchronization blocks 1204, 1205 while the controller for example controls the length of T3 according to the state diagram 600.

According to various embodiments, in other words, during a half-cycle, there is a period where synchronization triggers are rejected (i.e. ignored, i.e. no synchronization to received synchronization triggers takes place) and a second period, during which synchronization triggers are accepted (i.e. taken into account, i.e. a synchronization to a received synchronization trigger takes place).

The controller may prolong the second part to a length that is based on a of the time window in which the next synchronization trigger should occur, i.e. to cover a period during which the next synchronization trigger should occur. This allows achieving a fast locking of the oscillator to the reference signal (i.e. the synchronization signal).

According to various embodiments, an oscillator arrangement 1300 according to FIG. 13, or, equivalently, the synchronization mechanism according to the oscillator arrangement 1300, may for example be applied in chip cards (of arbitrary form factor) for use in radio communication (or also in a chip card reading device).

For example, it may be applied for a chip card using ISO/IEC 14443-A communication where, during PCD (proximity coupling device) transmission, the carrier is suppressed during pauses and must be quickly recovered and realigned in phase at the end of the pauses. Another possible application is a chip card using boosted NFC (Near-field communication) where typically, an internal PICC (proximity integrated circuit card) PLL must be locked to the PCD carrier using just few periods every some hundreds of free running periods. Indeed, in this case, using the synchronization mechanism according to various embodiments such as described above, the phase shift, accumulated during free running is immediately cancelled and the PLL regulation loop can then immediately operate on the effective period difference between PCD carrier and PICC PLL.

According to various embodiments a method as illustrated in FIG. 14 is carried out.

FIG. 14 shows a flow diagram 1400 illustrating a method for synchronizing an oscillator according to an embodiment.

In 1401, a synchronization signal including synchronization triggers is received.

In 1402, a synchronization trigger received during a first part of a half-cycle of an oscillation signal generated by the oscillator is rejected.

In 1403, the oscillator is synchronized to a synchronization trigger received during a second part of the half-cycle.

In 1404, the second part of the half-cycle in response to receiving a synchronization trigger during the first part of the half-cycle.

It should be noted that 1402, 1403, 1404 may occur in arbitrary order and may occur an arbitrary number of times.

Various Examples are described in the following:

Example 1 is an oscillator arrangement as illustrated in FIG. 13.

Example 2 is the oscillator arrangement of Example 1, wherein the synchronization triggers are synchronization pulses or signal edges.

Example 3 is the oscillator arrangement of Example 1 or 2, wherein the controller is configured to prolong the second part of the half-cycle by a predetermined time.

Example 4 is the oscillator arrangement of Example 1, wherein the controller is configured to prolong the second part of the half-cycle to a period during which a synchronization trigger is expected, based on a frequency of the synchronization signal, to occur after the rejected synchronization trigger.

Example 5 is the oscillator arrangement of any one of Examples 1 to 4, wherein the first part of the half-cycle has a predetermined length.

Example 6 is the oscillator arrangement of Example 5, wherein the predetermined length is a predetermined minimum length of the half-cycle.

Example 7 is the oscillator arrangement of any one of Examples 1 to 6, wherein the controller is configured to shorten the second part of the half-cycle in response to the prolonged second part of the half-cycle expiring without the input having received a synchronization trigger after prolonging the second part of the half-cycle.

Example 8 is the oscillator arrangement of Example 7, wherein the controller is configured to shorten the second part to a length that is shorter than the duration of the second part before prolonging the second part.

Example 9 is the oscillator arrangement of any one of Examples 1 to 8, wherein the controller is further configured to adjust the duration of the first half-cycle and the non-prolonged duration of the second half-cycle to the period of the synchronization signal.

Example 10 is the oscillator arrangement of any one of Examples 1 to 9, wherein the oscillation signal is a digital oscillation signal.

Example 11 is the oscillator arrangement of any one of Examples 1 to 10, wherein the oscillator comprises a flip-flop configured to output the oscillation signal.

Example 12 is the oscillator arrangement of any one of Examples 1 to 11, wherein the oscillation signal is for radio communication.

Example 13 is the oscillator arrangement of any one of Examples 1 to 12, wherein the input is configured receive the synchronization signal based on a radio communication signal.

Example 14 is the oscillator arrangement of any one of Examples 1 to 13, comprising a phase locked loop configured to tune the oscillation signal to the synchronization signal.

Example 15 is a method for synchronizing an oscillator as illustrated in FIG. 14.

Example 16 is the method of Example 15, wherein the synchronization triggers are synchronization pulses or signal edges.

Example 17 is the method of Example 15 or 16, comprising prolonging the second part of the half-cycle by a predetermined time.

Example 18 is the method of Example 15, comprising prolonging the second part of the half-cycle to a period during which a synchronization trigger is expected, based on a frequency of the synchronization signal, to occur after the rejected synchronization trigger.

Example 19 is the method of any one of Examples 15 to 18, wherein the first part of the half-cycle has a predetermined length.

Example 20 is the method of Example 19, wherein the predetermined length is a predetermined minimum length of the half-cycle.

Example 21 is the method of any one of Examples 15 to 20, comprising shortening the second part of the half-cycle in response to the prolonged second part of the half-cycle expiring without the input having received a synchronization trigger after prolonging the second part of the half-cycle.

Example 22 is the method of Example 21, comprising shortening the second part to a length that is shorter than the duration of the second part before prolonging the second part.

Example 23 is the method of any one of Examples 15 to 22, comprising adjusting the duration of the first half-cycle and the non-prolonged duration of the second half-cycle to the period of the synchronization signal.

Example 24 is the method of any one of Examples 15 to 23, wherein the oscillation signal is a digital oscillation signal.

Example 25 is the method of any one of Examples 15 to 24, wherein the oscillator outputs the oscillation signal by means of a flip-flop.

Example 26 is the method of any one of Examples 15 to 25, wherein the oscillation signal is for radio communication.

Example 27 is the method of any one of Examples 15 to 26, comprising receiving the synchronization signal based on a radio communication signal.

Example 28 is the method of any one of Examples 15 to 27, comprising tuning the oscillation signal to the synchronization signal by means of a phase locked loop.

According to a further example, a synchronised oscillator and a corresponding oscillator synchronization method are provided comprising an oscillator configured to generate an oscillation signal and a synchronizer configured to synchronize the oscillator to a synchronization trigger if the synchronization trigger occurs during the second part of a second half-cycle of the oscillation signal and, if a synchronization trigger occurs during the first half-cycle of the oscillation signal or a first part of the second half-cycle of the oscillation signal, to ignore the synchronization trigger and to increase the length of the second part of the second half-cycle.

It should be noted that the above examples may be combined in any way.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

LIST OF REFERENCE SIGNS

101 oscillator
102 oscillation signal
103 synchronization signal
104 synchronization signal source
201-203 state diagram transitions
301 synchronization triggers
302 first half-cycles
401 synchronization triggers
501-504 state diagram transitions
601-603 state diagram states
604-610 state diagram transitions
701 synchronization triggers
801,802 synchronization triggers
901 semi-period
902 dotted line
1001 synchronization trigger
1101 synchronization trigger
1102 T2 period
1103 synchronization trigger
1201 SR-Flip-Flop
1202, 1203 delay blocks
1204, 1205 synchronization blocks
1206 OR gate
1207 calibration block
1301 oscillator
1302 oscillation signal
1303 input
1304 synchronization signal 1305 synchronizer
1306 controller

What is claimed is:

1. An oscillator arrangement, comprising:
an oscillator configured to generate an oscillation signal having two half-cycles;
an input configured to receive a synchronization signal including synchronization triggers;
a synchronizer configured to reject a synchronization trigger received during a first part of a half-cycle and to synchronize the oscillator to a synchronization trigger received during a second part of the half-cycle; and
a controller configured to prolong the second part of the half-cycle in response to receiving a synchronization trigger during the first part of the half-cycle.

2. The oscillator arrangement of claim 1, wherein the synchronization triggers are synchronization pulses or signal edges.

3. The oscillator arrangement of claim 1, wherein the controller is configured to prolong the second part of the half-cycle by a predetermined time.

4. The oscillator arrangement of claim 1, wherein the controller is configured to prolong the second part of the half-cycle to a period during which a synchronization trigger is expected, based on a frequency of the synchronization signal, to occur after the rejected synchronization trigger.

5. The oscillator arrangement of claim 1, wherein the first part of the half-cycle has a predetermined length.

6. The oscillator arrangement of claim 5, wherein the predetermined length is a predetermined minimum length of the half-cycle.

7. The oscillator arrangement of claim 1, wherein the controller is configured to shorten the second part of the half-cycle in response to the prolonged second part of the half-cycle expiring without the input having received a synchronization trigger after prolonging the second part of the half-cycle.

8. The oscillator arrangement of claim 7, wherein the controller is configured to shorten the second part to a length that is shorter than the duration of the second part before prolonging the second part.

9. The oscillator arrangement of claim 1, wherein the controller is further configured to adjust the duration of the first half-cycle and the non-prolonged duration of the second half-cycle to the period of the synchronization signal.

10. The oscillator arrangement of claim 1, wherein the oscillation signal is a digital oscillation signal.

11. The oscillator arrangement of claim 1, wherein the oscillator comprises a flip-flop configured to output the oscillation signal.

12. The oscillator arrangement of claim 1, wherein the oscillation signal is for radio communication.

13. The oscillator arrangement of claim 1, wherein the input is configured receive the synchronization signal based on a radio communication signal.

14. The oscillator arrangement of claim 13, comprising a phase locked loop configured to tune the oscillation signal to the synchronization signal.

15. A method for synchronizing an oscillator, comprising:
receiving, by an input, a synchronization signal including synchronization triggers;
rejecting, by a synchronizer, a synchronization trigger received during a first part of a half-cycle of an oscillation signal generated by the oscillator;
synchronizing, by the synchronizer, the oscillator to a synchronization trigger received during a second part of the half-cycle; and
prolonging, by a controller, the second part of the half-cycle in response to receiving a synchronization trigger during the first part of the half-cycle.

16. The method of claim 15, further comprising:
prolonging, by the controller, the second part of the half-cycle by a predetermined time.

17. The method of claim 15, further comprising:
prolonging, by the controller, the second part of the half-cycle to a period during which a synchronization trigger is expected, based on a frequency of the synchronization signal, to occur after the rejected synchronization trigger.

18. The method of claim 15, further comprising:
shortening, by the controller, the second part of the half-cycle in response to the prolonged second part of the half-cycle expiring without the input having received a synchronization trigger after prolonging the second part of the half-cycle.

19. The method of claim 18, further comprising:
shortening, by the controller, the second part to a length that is shorter than the duration of the second part before prolonging the second part.

20. The method of claim 15, further comprising:
adjusting, by the controller, the duration of the first half-cycle and the non-prolonged duration of the second half-cycle to the period of the synchronization signal.

* * * * *